US009270180B2

(12) United States Patent
Rommel

(10) Patent No.: US 9,270,180 B2
(45) Date of Patent: Feb. 23, 2016

(54) DC-DC CONVERTER WITH ADAPTIVE MINIMUM ON-TIME

(71) Applicant: Texas Instruments Deutschland GmbH, Freising (DE)

(72) Inventor: Markus G. Rommel, Freising (DE)

(73) Assignee: Texas Instruments Deutschland GmbH, Freising (DE)

(*) Notice: Subject to any disclaimer, the term of this patent is extended or adjusted under 35 U.S.C. 154(b) by 5 days.

(21) Appl. No.: 13/886,993

(22) Filed: May 3, 2013

(65) Prior Publication Data

US 2014/0327422 A1 Nov. 6, 2014

(51) Int. Cl.
*H02M 3/157* (2006.01)
*H02M 3/158* (2006.01)
*H03K 17/082* (2006.01)

(52) U.S. Cl.
CPC ......... *H02M 3/1588* (2013.01); *H03K 17/0822* (2013.01); *H03K 2217/0063* (2013.01); *H03K 2217/0072* (2013.01); *Y02B 70/1466* (2013.01)

(58) Field of Classification Search
CPC ....................................................... H02M 3/157
USPC ................................................ 323/282, 283
See application file for complete search history.

(56) References Cited

U.S. PATENT DOCUMENTS

| 5,481,178 A * | 1/1996 | Wilcox et al. ................. 323/287 |
| 5,736,872 A * | 4/1998 | Sharma et al. ..................... 327/3 |
| 8,519,691 B2 * | 8/2013 | McCloy-Stevens .......... 323/284 |
| 2004/0120090 A1 * | 6/2004 | Galli et al. ..................... 361/115 |
| 2006/0220625 A1 * | 10/2006 | Chapuis ......................... 323/282 |
| 2006/0221528 A1 * | 10/2006 | Li et al. ......................... 361/100 |
| 2008/0054825 A1 * | 3/2008 | Gulsen et al. ................. 315/307 |
| 2009/0295344 A1 * | 12/2009 | Qu ................................. 323/265 |
| 2010/0188014 A1 * | 7/2010 | Lundstrum et al. ........... 315/291 |
| 2013/0049716 A1 * | 2/2013 | Saeki ............................ 323/271 |

* cited by examiner

*Primary Examiner* — Emily P Pham
(74) *Attorney, Agent, or Firm* — William B. Kempler; Frank D. Cimino

(57) ABSTRACT

A DC-DC converter has a high-side transistor series with a low-side transistor and an inductor connected to a node therebetween, a gate driver circuit has a high-side gate driver circuit coupled to the high-side transistor; a low-side gate driver circuit coupled to the low-side transistor; a minimum pulse with circuit coupled to one of the high-side and low-side gate, the minimum pulse width circuit adaptively controlling a pulse width of a drive signal to the high-side or low-side transistor by the propagation delay of the respective gate driver circuit.

9 Claims, 5 Drawing Sheets

DC-DC CONVERTER WITH ADAPTIVE MINIMUM ON-TIME

FIELD OF THE INVENTION

The invention relates to a DC-DC converter and more specifically to a DC-DC converter having a circuit coupled to one of the high-side and low-side gate driver circuits for adaptively controlling a pulse width of a drive signal by the propagation delay of the respective gate driver circuit.

BACKGROUND OF THE INVENTION

DC-DC converters are widely utilized for converting an input voltage to an output voltage at high efficiency. DC-DC converters are available in various topologies including buck converters, boost converters and buck-boost converters, as well as other topologies.

FIG. 1 shows an example buck converter generally as 100. The converter has a control logic circuit 102 which receives an input signal related to the output voltage (not shown) and generates a control signal GD_IN which is coupled to a gate driver circuit 104. The signal GD_IN may be a pulse width modulated (PWM) signal, for example. The gate driver 104 converts the signal GD_IN to a drive signal G_HSD for a high-side transistor 106 and G_LSD for a low-side transistor 108. The high-side transistor 106 and low-side transistor 108 are coupled in series between the input voltage and ground and have a switching node SW therebetween. The switching node is coupled to one terminal of inductor 114 the other terminal of which is coupled to the output voltage. An output capacitor 116 is coupled between the output voltage and ground. The circuit shown in FIG. 1 also shows an optional high-side current limit circuit 110 and low-side current limit circuit 112, which are known in the art.

The gate driver circuit 104 has as one of its functions and anti shoot-through function which prevents both the high-side transistor 106 and low-side transistor 108 from being on at the same time. If both transistors were to be on at the same time it would be a virtual short between the input voltage and ground which not only dramatically reduces the efficiency of the converter, it may produce irreversible damage to the transistors resulting in a failure of the DC-DC converter. Another function of the gate driver 104 is to generate a drive signal having sufficient strength to charge the gate capacitances of the high-side transistor 106 and low-side transistor 108.

A prior art digital gate drive circuit is shown in FIG. 2 generally as 200. The gate drive circuit 200 receives two input signals. The first signal GD_EN received at terminal 204 is an active low-enable signal which is used to tri-state the gate driver and place both the high-side and low-side transistors in an off condition. The second signal GD_IN is received terminal 202. When the signal is low, the high-side transistor 106 is ON and when the signal is high this transistor is OFF and the low-side transistor 108 is ON. The drive circuit for the high-side transistor and low-side transistor are identical and only the high-side circuit will be described. In this embodiment, the high-side transistor is PMOS transistor and the low-side transistor is in an NMOS transistor. Those skilled in the art recognize that, if the high-side transistor is an NMOS transistor instead of a PMOS transistor, a signal of opposite polarity is needed for driving the high-side transistor. This signal could be the signal on line 238, for example.

The high-side driver comprises a two input NOR gate 208 having one input coupled to signal GD_IN and another input coupled to the inverted signal GD_EN. The output of NOR gate 208 is coupled through inverter 210 to an input of a two input OR gate 212. The second input of OR gate 212 is coupled to the signal G_LSD via link 240, which is a drive signal for the low-side transistor 108. The output of OR gate 212 is connected to a string of inverters 214, 216, 218 and 220 the output of which generates the high-side drive signal G_HSD at terminal 222. Each of the inverters 214, 216, 218 and 220 generates a higher current signal than the circuit that precedes it, typically by three or four times the input current. Thus the number of inverters (or buffers) in the drive circuit is determined by the drive requirements of the high-side PMOS transistor 106. These two requirements dictate the propagation delay of the string of inverters as the number and size of capacitances to be charged increases.

The enable signal GD_EN is active low, so it will be high when the converter is operating. The signal GD_IN is low to turn the transistor 106 ON. These two signals are input to NOR gate 208, generating a digital zero at the output. This signal is inverted by inverter 210 and input to OR gate 212. The other input of OR gate 212 is the drive signal for the low-side transistor 106, which will be low if that transistor is OFF. The output of OR gate 212 is therefore low which results in a signal on terminal 222 that is also low, thus turning ON high-side PMOS transistor 106.

FIG. 3 illustrates the problem with driver circuit 200 if the input pulse GD_IN from control logic 102 to gate driver 104 is too narrow. In FIG. 3 an NMOS transistor was used as the high-side transistor and the gate drive signal would be the signal on line 238 shown in FIG. 2, for example. In FIG. 3, signal 302 represents the output current. Signal 304 represents the current through the high-side transistor 106 and signal 305 represents the current through the low-side transistor 108. Signal 310 represents the gate voltage signal having an input pulse 306 which has a leading edge 308. Signal 312 represents the voltage on the gate of the low-side transistor 106 and signal 314 represents the voltage on the gate of high-side transistor 108. Signal 324 represents the drain-to-source voltage the high-side transistor 106 and signal 326 represents the drain-to-source voltage of the low-side transistor 108. The plurality of inverters 214, 216, 218, 220 (buffers) generate a delay between the time the pulse is received on line 202 and a gate signal is provided to turn ON one of the output transistor 106, 108 and turn the transistor 106 OFF. Thus, the time between leading edge 308 of pulse 306 and time required to turn OFF transistor 108 is too short so that, as indicated at 316, the low-side transistor 108 is still ON while the high-side transistor 106 is turning ON and, as indicated at 318, the low-side transistor is turning ON before the high-side transistor has turned OFF. This, along with the parasitic inductance of the circuit, causes ringing, as shown at 320, 322, and 330, 332. This can cause shoot-through and the loss of stability of the converter as shown at 320, 322 and 330, 332.

Thus, there is a need for a gate driver circuit that can provide appropriate drive signals to the high-side and low-side transistors to avoid shoot-through and loss of control of the converter.

SUMMARY OF THE INVENTION

It is a general object of the invention to provide a gate driver circuit for a DC-DC converter.

In an aspect of the invention a DC-DC converter having a high-side transistor series with a low-side transistor and an inductor connected to a node therebetween, a gate driver circuit comprises a high-side gate driver circuit coupled to the high-side transistor; a low-side gate driver circuit coupled to the low-side transistor; a minimum pulse with circuit coupled to one of the high-side and low-side gate, the minimum pulse width circuit adaptively controlling a pulse width of a drive signal to the high-side or low-side transistor by the propagation delay of the respective gate driver circuit.

In an embodiment, a DC-DC converter comprises a high-side transistor coupled between a source of voltage and a switching node; a low-side transistor coupled between the switching node and a reference potential; an inductor coupled between the switching node and an output terminal; a capacitor coupled between the output terminal and the reference potential; a digital drive circuit to drive the high-side and low-side transistors, the digital drive circuit having a logic circuit controlling a storage element for adaptively controlling width of a pulse by propagation delay of the drive circuit for driving one of the high side and low-side transistors.

Another aspect of the invention includes a method of operating a DC-DC converter having a high-side transistor in series with a low-side transistor and an inductor coupled to a node therebetween, comprising: generating pulse width modulated (PWM) drive signals in a drive circuit for at least one of the high-side and low-side transistors; adaptively controlling a pulse width of the PWM drive signal by the propagation delay of the drive circuit.

BRIEF DESCRIPTION OF DRAWINGS

Further aspects of the invention will appear from the appending claims and from the following detailed description given with reference to the appending drawings.

DETAILED DESCRIPTION OF EXAMPLE EMBODIMENT

Figure 1:
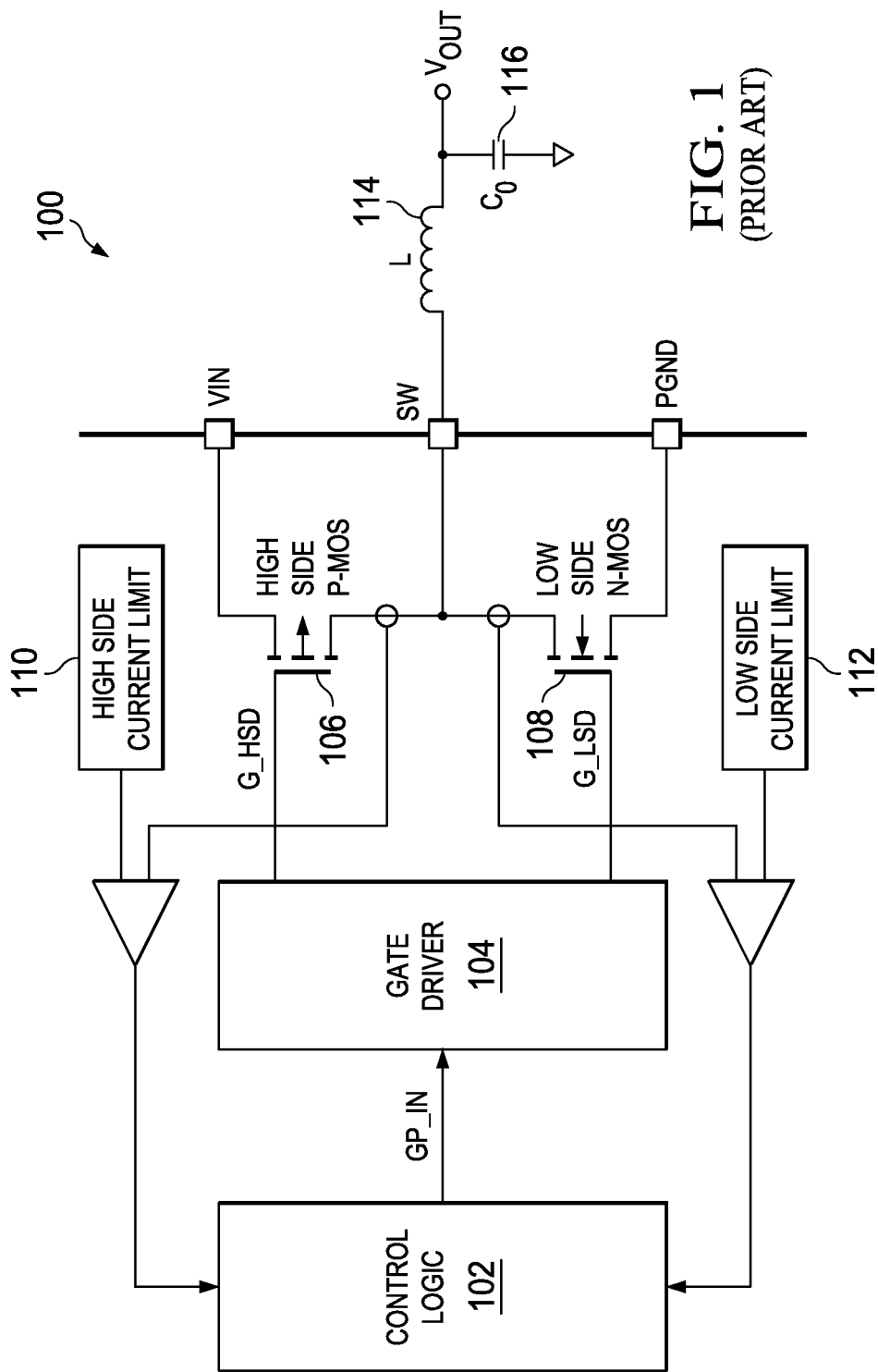
FIG. 1 is a schematic block diagram of a prior art DC-DC converter.
Figure 2:
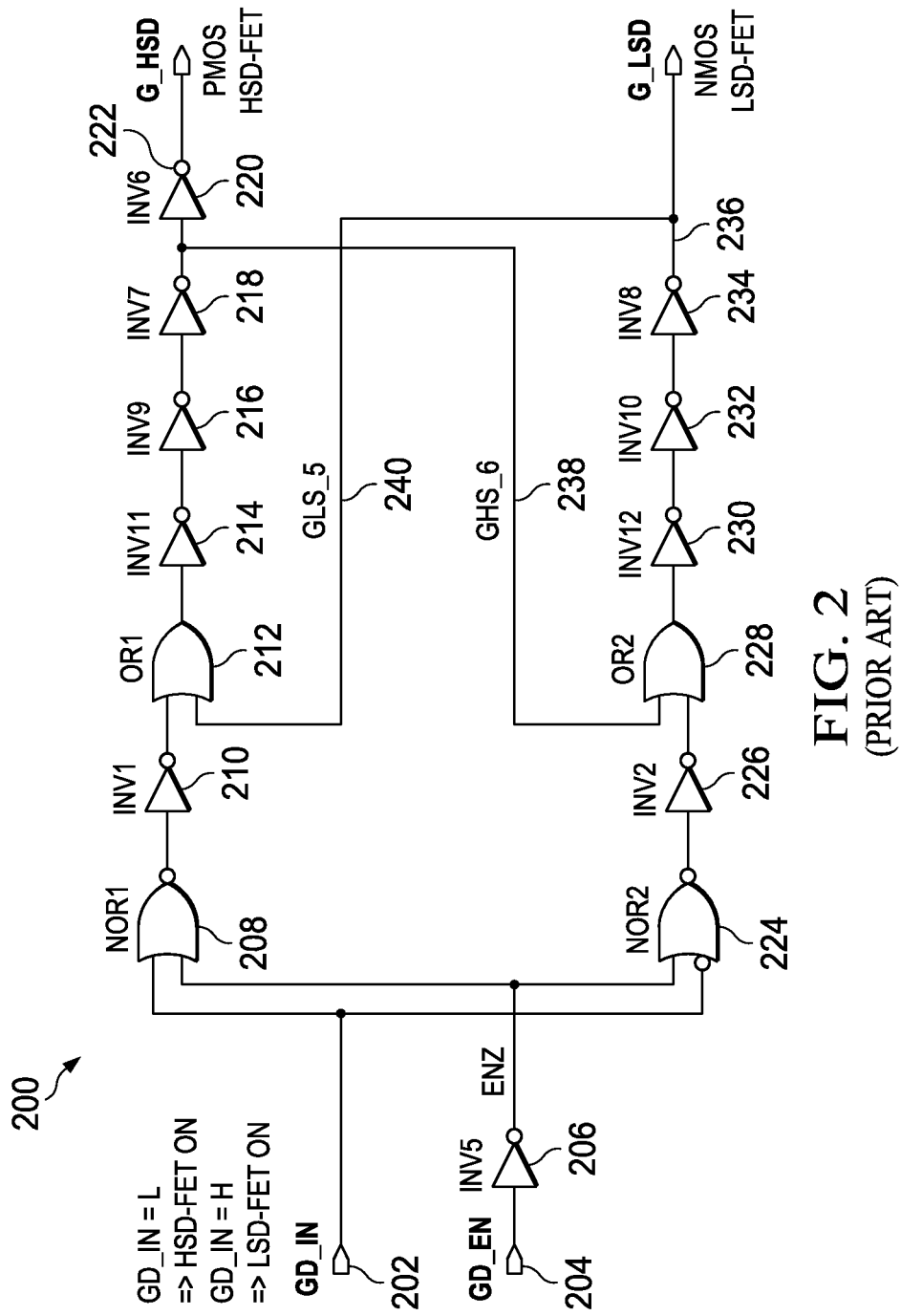
FIG. 2 is a schematic of a driver circuit for the DC-DC converter of FIG. 1.
Figure 4:
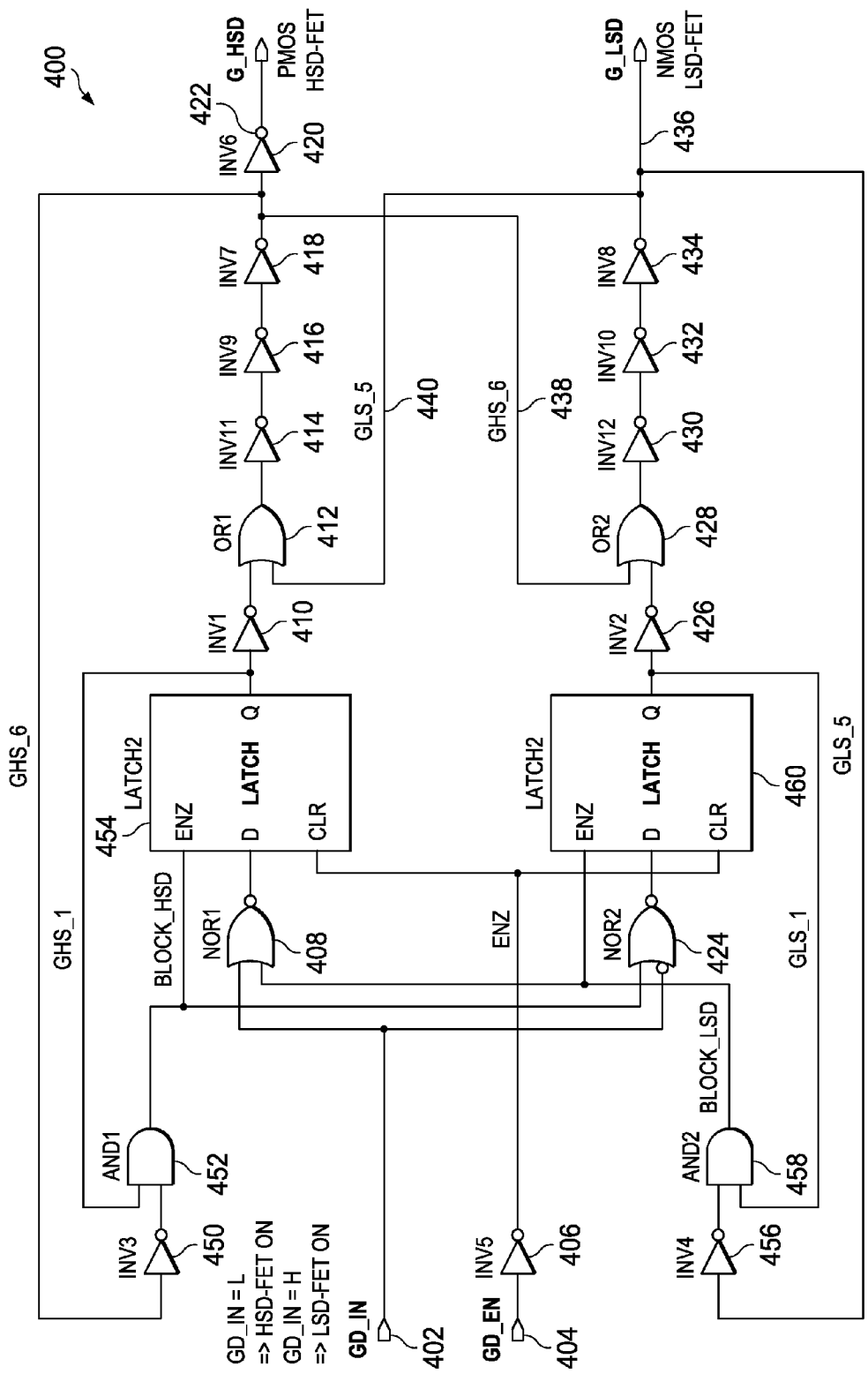
FIG. 4 is a schematic diagram of a driver circuit according to the present invention.

FIG. 4 illustrates an improved gate driver circuit for use with the DC-DC converter shown in FIG. 1 generally as 400. Elements in FIG. 4 that are similar to the elements found in the circuit of FIG. 2 have similar reference numerals. Thus, the inverter 410, OR gate 412 and inverters 414, 416, 418, 420 correspond to the inverter 210, OR gate 212 and inverters 214, 216, 218, 220 of FIG. 2. The drive circuit for the High-side transistor and low-side transistor are identical and only the high-side circuit will be described. The inverter 450 receives the output of inverter 418 and has an output coupled to one input of a two input AND gate 452, the other input of which is coupled to the Q output of latch 454. The output of AND gate 452 is the block_HSD signal supplied to the ENZ input of latch 454. The signal is also applied to one input of two input NOR gate 424, which is part of the drive circuit for the load the low-side transistor and which is not being described here. NOR gate 408 corresponds to NOR gate 208 in FIG. 2 except that the second input is coupled to the output of AND gate 458 which generates the block_LSD signal instead of the GD_EN signal as shown in FIG. 2. NOR gate 408 has an output connected to the D input of latch 454 and a first input connected to receive the signal GD_IN and a second input coupled to receive the block_LSD signal from AND gate 458. The signal GD_EN is coupled through inverter 406 to the CLR input of latch 454.

Next, we will describe the turning ON of the high side transistor 106. High-side transistor 106 is a PMOS transistor. Those skilled in the art recognize that, if the high-side transistor is an NMOS transistor instead of a PMOS transistor, a signal of opposite polarity is needed for driving the high-side transistor. This signal could be the signal on line 438, for example. If transistor 106 is OFF, then signal on in 422 must be a logical high. Therefore, the signal on the output of inverter 418 is a logical low which is inverter by inverter 450 to produce and logical one on one input of AND gate 452. The other input of AND gate 452 is connected to the Q output of the latch 454, which is a logical zero. The output of AND gate 452 will therefore be a logical zero which will be connected to the ENZ input of latch 454. The ENZ signal is active low. The first input signal to NOR gate 408 is the block_LSD signal from AND gate 458, which will be a logical low. The second input to NOR gate 408 is the GD_IN signal which will go to a logical low to turn the high-side transistor 106 ON. The output of NOR gate 408 is a logical one to the D input of latch 454. The Q output of latch 454 will therefore be set to a logical one. Thus, the output of inverter 410 becomes a logical zero. This will cause the output of OR gate 412 to become a logical zero which is inverted by inverter 414 to logical one, inverted by inverter 416 to a logical zero, inverted by inverter 418 to a logical one and inverted by inverter 422 a logical zero. The logical zero will be applied to the gate of PMOS high-side transistor 106, which will turn it ON.

Figure 3:
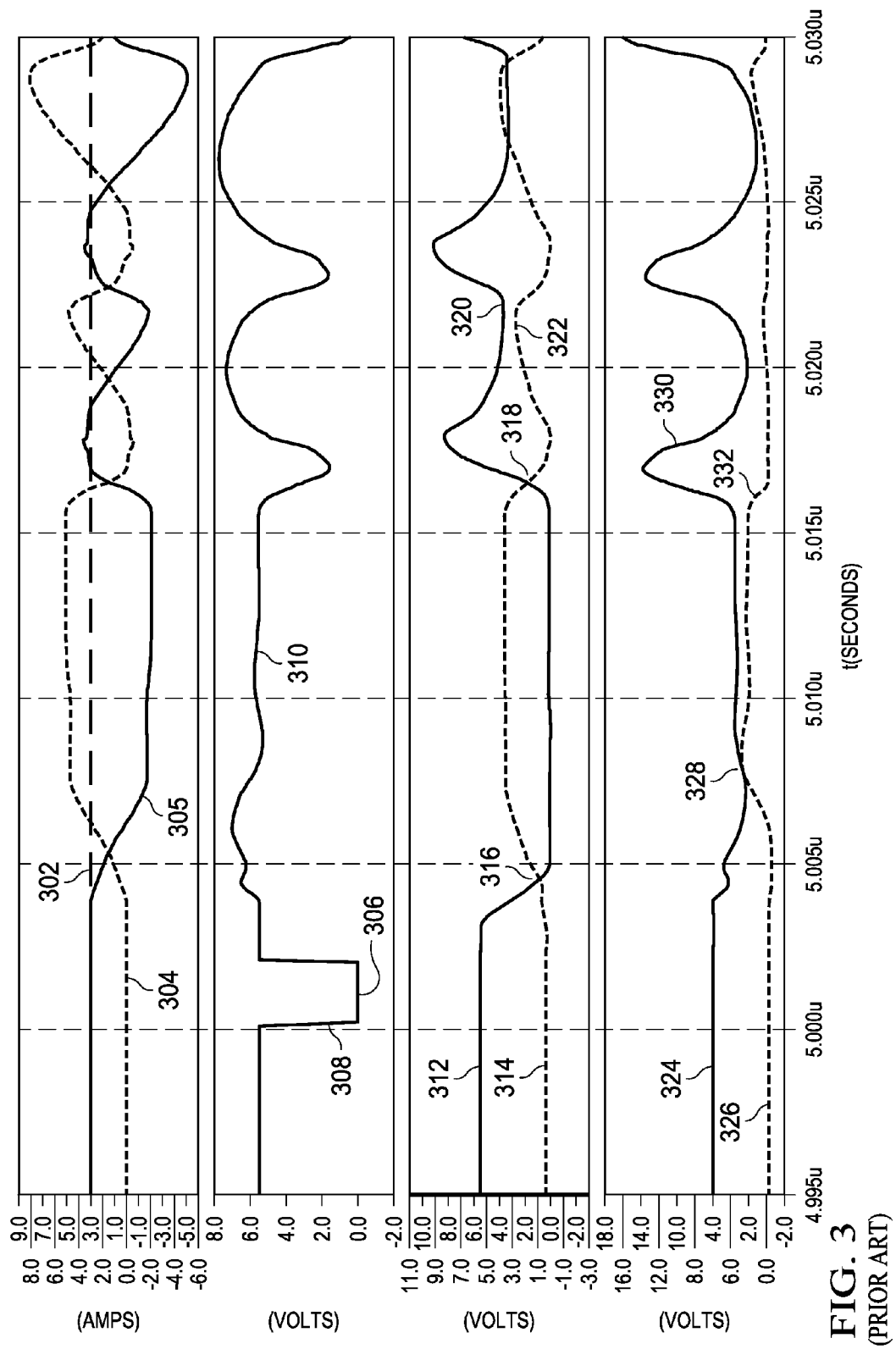
FIG. 3 illustrates the waveforms of the circuit shown in FIGS. 1 and 2.
Figure 5:
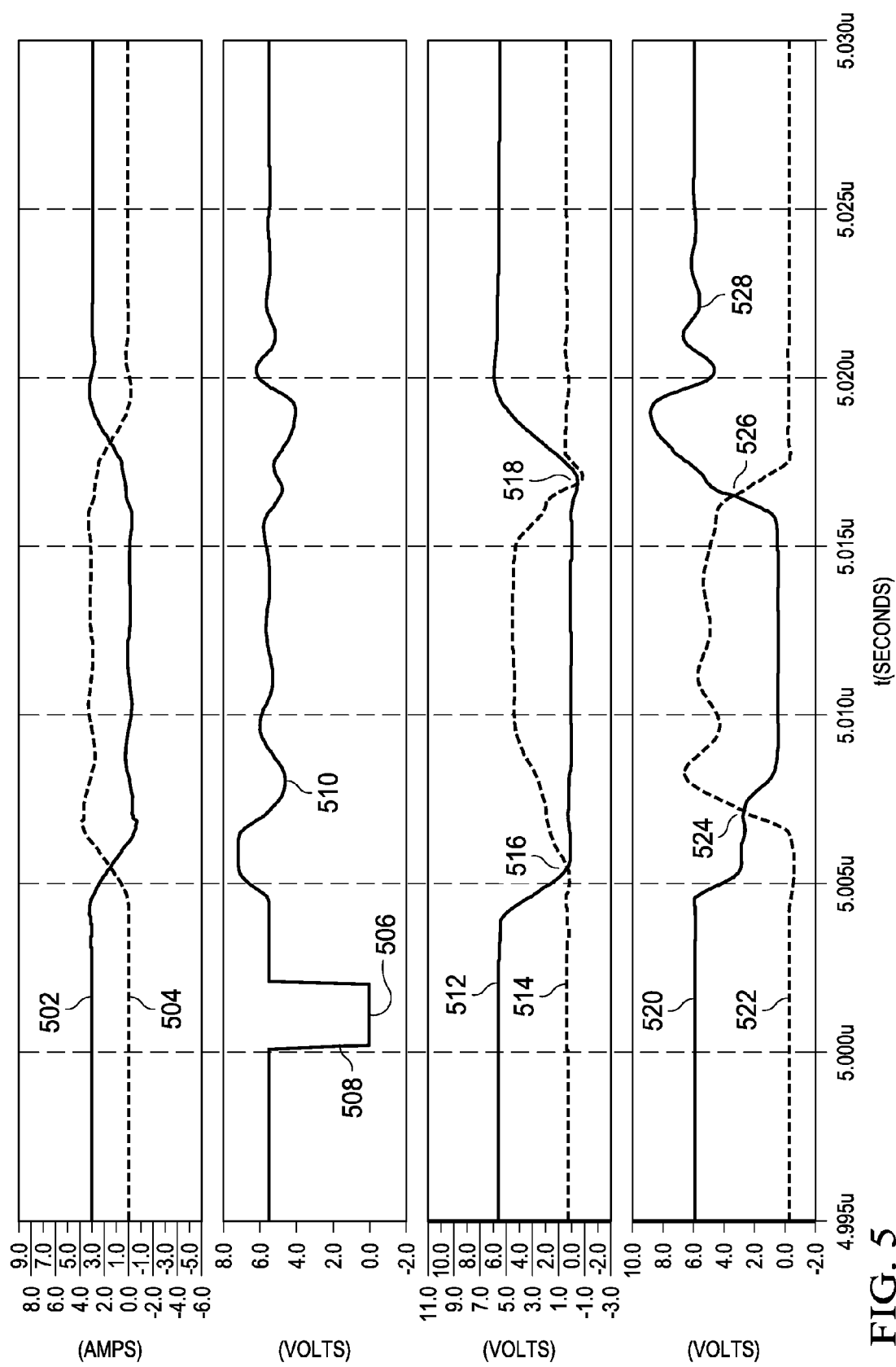
FIG. 5 illustrates the waveforms of the circuit shown in FIG. 4.

FIG. 5 illustrates the waveforms of FIG. 3 showing the advantages of the present invention. Waveforms in FIG. 5 that are similar to the waveforms illustrated in FIG. 3 have similar reference numerals. In FIG. 5 an NMOS transistor was used as the high-side transistor and the gate drive signal would be the signal on line 438 shown in FIG. 2, for example. In FIG. 5, signal 502 represents the output current. Signal 504 represents the current through the high-side transistor 106 and signal 505 represents the current through the low-side transistor 108. Signal 510 represent the signal having an input pulse 506 which has a leading edge 508. Signal 512 represents the voltage on the gate of the low-side transistor 106 and signal 514 represents the voltage on the gate of high-side transistor 108. Signal 524 represents the drain-to-source voltage, the high-side transistor 106 and signal 526 represents the drain-to-source voltage of the load-side transistor 108.

In FIG. 5, the input pulse 506 is of the same width as the input pulse 306 shown in FIG. 3. However, because of the present invention, the gate voltages 512, 514 show no overlap at the transitions 516, 518. The drain-to-source voltages 520, 522 on the transistors 106, 108 show normal transitions at 524, 526 versus the gate voltages 320, 322 of FIG. 3. There is no loss of control at 528, as seen at 330, 332 in FIG. 3.

Although the invention has been described in detail, it should be understood that various changes, substitutions and alterations can be made thereto without departing from the spirit and scope of the invention as defined by the appended claims. For example, although a buck topology is shown, other topologies can also benefit from the present invention.

The invention claimed is:

1. In a DC-DC converter having a high-side transistor in series with a low-side transistor and an inductor connected to a node therebetween, a gate driver circuit comprising:

a high-side gate driver circuit coupled to the high-side transistor;

a low-side gate driver circuit coupled to the low-side transistor;

a pulse width circuit coupled to the high-side gate driver circuit, the pulse width circuit adaptively increasing a pulse width of a drive signal to the high-side transistor by a propagation delay of the high-side gate driver circuit, the pulse width circuit further coupled to the low-side gate driver circuit, the pulse width circuit adaptively increasing a pulse width of a drive signal to the low-side transistor by a propagation delay of the low-side gate driver circuit, wherein a minimum pulse width applied to the low-side gate driver circuit makes a width of a pulse signal shorter for extremely long pulse signals and wherein the high-side and the low-side gate driver circuits comprise digital logic circuits driving a digital memory storage element.

2. The gate driver circuit of claim 1 wherein the minimum pulse width circuit is coupled to both the high-side and low-side transistors.

3. The gate driver circuit of claim 2 wherein the high-side transistor is a PMOS transistor and low-side transistor is an NMOS transistor.

4. The gate driver circuit of claim 1 wherein the high-side transistor is a PMOS transistor and low-side transistor is an NMOS transistor.

5. The gate driver circuit of claim 1 wherein the high-side transistor is a PMOS transistor and low-side transistor is an NMOS transistor.

6. A DC-DC converter comprising:
a high-side transistor coupled between a source of voltage and a switching node;
a low-side transistor coupled between the switching node and a reference potential;
an inductor coupled between the switching node and an output terminal;
a capacitor coupled between the output terminal and the reference potential;
a digital drive circuit having high-side and low-side drivers coupled to drive the high-side and low-side transistors, respectively, the digital drive circuit having a logic circuit controlling a storage element for adaptively controlling width of a pulse driving the high-side transistor or low-side transistor by a propagation delay of the digital drive circuit, wherein the width of a pulse driving the high-side transistor, if below a first predetermined width, is increased by a propagation delay of the high-side gate driver and the width of the pulse driving the low-side transistor, if below a predetermined second width, is increased by a propagation delay of the low-side driver wherein a minimum pulse width applied to the low-side driver makes the width of a pulse signal shorter for extremely long pulse signals and wherein high-side and low-side drivers comprise digital logic circuits driving a digital memory storage element.

7. The DC-DC converter of claim 6 wherein the high-side transistor is a PMOS transistor and low-side transistor is an NMOS transistor.

8. The DC-DC converter of claim 6 wherein the high-side transistor is a PMOS transistor and low-side transistor is an NMOS transistor.

9. A method of operating a DC-DC converter having a high-side transistor in series with a low-side transistor and an inductor coupled to a node therebetween, comprising:
generating pulse width modulated (PWM) drive signals in a drive circuit for at least one of the high-side and low-side transistors; and
adaptively controlling a pulse width of the PWM drive signal by a propagation delay of the drive circuit, to provide an adaptive control of the pulse width, wherein a pulse width of the PWM drive signal for the high-side transistor, if below a first predetermined threshold, is increased by a first propagation delay of the high-side drive circuit or pulse width of the PWM drive signal for the low-side transistor, if below a second predetermined threshold, is increased by a propagation delay of a low-side drive circuit, wherein a minimum pulse width applied to the low-side drive circuit makes the width of the pulse signal shorter for extremely long pulse signals and wherein the adaptive control of the pulse width is performed in a digital logic circuit including a digital storage element.

\* \* \* \* \*